(12) United States Patent
Krasnov et al.

(10) Patent No.: US 7,989,072 B2
(45) Date of Patent: Aug. 2, 2011

(54) COATED ARTICLE WITH TRANSPARENT CONDUCTIVE OXIDE FILM DOPED TO ADJUST FERMI LEVEL, AND METHOD OF MAKING SAME

(75) Inventors: Alexey Krasnov, Canton, MI (US); Yiwei Lu, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 92 days.

(21) Appl. No.: 12/588,677

(22) Filed: Oct. 23, 2009

(65) Prior Publication Data
US 2010/0040892 A1    Feb. 18, 2010

Related U.S. Application Data

(62) Division of application No. 11/173,157, filed on Jul. 5, 2005, now Pat. No. 7,628,896.

(51) Int. Cl.
*B32B 15/00* (2006.01)
*B32B 17/06* (2006.01)

(52) U.S. Cl. ........ 428/432; 428/426; 428/469; 428/472; 428/472.1; 428/472.2; 428/688; 428/689; 428/697; 428/701; 428/702; 359/580; 359/581; 359/582; 359/585; 359/586

(58) Field of Classification Search .................. 428/426, 428/432, 469, 472, 472.1, 472.2, 688, 689, 428/697, 701, 702; 359/580–582, 585–586
See application file for complete search history.

(56) References Cited

U.S. PATENT DOCUMENTS

| | | | |
|---|---|---|---|
| 3,995,940 A * | 12/1976 | Guyon et al. | ................. 359/297 |
| 4,404,117 A | 9/1983 | Gugenberger | |
| 5,304,499 A | 4/1994 | Bonnet et al. | |
| 5,387,433 A | 2/1995 | Balian et al. | |
| 5,773,086 A | 6/1998 | McCurdy et al. | |
| 5,922,142 A | 7/1999 | Wu et al. | |
| 6,169,246 B1 | 1/2001 | Wu et al. | |

(Continued)

FOREIGN PATENT DOCUMENTS

DE    197 32 978    11/1998

(Continued)

OTHER PUBLICATIONS

U.S. Appl. No. 11/173,157, filed Jul. 5, 2005; Krasnov et al.

(Continued)

*Primary Examiner* — Kevin M Picardat
*Assistant Examiner* — Bac H Au
(74) *Attorney, Agent, or Firm* — Nixon & Vanderhye P.C.

(57) ABSTRACT

A transparent conductive oxide (TCO) based film is formed on a substrate. The film may be formed by sputter-depositing, so as to include both a primary dopant (e.g., Al) and a co-dopant (e.g., Ag). The benefit of using the co-dopant in depositing the TCO inclusive film may be two-fold: (a) it may prevent or reduce self-compensation of the primary dopant by a more proper positioning of the Fermi level, and/or (b) it may promote declustering of the primary dopant, thereby freeing up space in the metal sublattice and permitting more primary dopant to create electrically active centers so as to improve conductivity of the film. Accordingly, the use of the co-dopant permits the primary dopant to be more effective in enhancing conductivity of the TCO inclusive film, without significantly sacrificing visible transmission characteristics. An example TCO in certain embodiments is $ZnAlO_x$:Ag.

7 Claims, 1 Drawing Sheet

U.S. PATENT DOCUMENTS

| | | | |
|---|---|---|---|
| 6,190,511 B1 | 2/2001 | Wei | |
| 6,221,495 B1 | 4/2001 | Wu et al. | |
| 6,251,701 B1 | 6/2001 | McCandless | |
| RE37,446 E | 11/2001 | Miyazaki et al. | |
| 6,398,925 B1 * | 6/2002 | Arbab et al. | 204/192.22 |
| 6,436,541 B1 | 8/2002 | Sopko et al. | |
| 6,458,673 B1 | 10/2002 | Cheung | |
| 6,586,119 B1 | 7/2003 | Hashimoto et al. | |
| 6,602,606 B1 | 8/2003 | Fujisawa et al. | |
| 6,762,553 B1 * | 7/2004 | Yokogawa et al. | 313/509 |
| 6,809,850 B2 * | 10/2004 | Toyoshima | 359/259 |
| 6,881,505 B2 | 4/2005 | Tixhon | |
| 6,917,158 B2 | 7/2005 | Lee et al. | |
| 7,184,190 B2 * | 2/2007 | McCabe et al. | 359/265 |
| 7,537,677 B2 * | 5/2009 | Lu et al. | 204/192.27 |
| 7,628,896 B2 | 12/2009 | Krasnov et al. | |
| 2002/0064662 A1 | 5/2002 | Lingle et al. | |
| 2002/0109458 A1 | 8/2002 | Pichler et al. | |
| 2003/0150711 A1 | 8/2003 | Laird | |
| 2003/0198816 A1 | 10/2003 | Lingle et al. | |
| 2003/0227250 A1 | 12/2003 | Nee | |
| 2004/0005467 A1 | 1/2004 | Neuman et al. | |
| 2004/0020761 A1 | 2/2004 | Thomsen et al. | |
| 2004/0043226 A1 | 3/2004 | Laird et al. | |
| 2004/0121163 A1 | 6/2004 | Laird | |
| 2005/0145972 A1 * | 7/2005 | Fukuda et al. | 257/458 |
| 2006/0219549 A1 | 10/2006 | Mishima et al. | |

FOREIGN PATENT DOCUMENTS

| | | |
|---|---|---|
| DE | 198 48 751 | 12/1999 |
| EP | 1 043 606 | 10/2000 |

OTHER PUBLICATIONS

"Fabrication of the Low-Resistive P-Type ZnO by Codoping Method", Joseph et al., Physica B 302-303 (200) 140-148.

"Effects of Dopants and Hydrogen on the Electrical Conductivity of ZnO", Zhou et al., Journal of the European Ceramic Society 24 (2004) 139-146.

"Recent Advances in Processing of ZnO", Pearton et al., J. Vac. Sci Technol. B 22(3) May/Jun. 2004 (932-948).

International Search Report dated Dec. 6, 2006.

* cited by examiner

COATED ARTICLE WITH TRANSPARENT CONDUCTIVE OXIDE FILM DOPED TO ADJUST FERMI LEVEL, AND METHOD OF MAKING SAME

This application is a divisional of application Ser. No. 11/173,157, filed Jul. 5, 2005, now U.S. Pat. No. 7,628,896, the entire disclosure of which is hereby incorporated herein by reference in this application.

This invention relates to a coated article including a transparent conductive oxide (TCO) film that is doped to adjust the Fermi level, and a method of making the same. In certain example embodiments, a TCO such as zinc aluminum oxide ($ZnAlO_x$) or the like is doped with an acceptor or co-dopant such as silver (Ag) or the like. The silver co-dopant prevents or reduces self-compensation of the primary dopant by native defects as well as promotes declustering of the primary dopant (e.g., Al) thereby freeing up space in the sublattice and permitting more Al to function as a donor. Thus, conductivity of the TCO film can be improved. Moreover, in certain example embodiments, this technique also permits good quality TCO inclusive films to be deposited at low temperatures (e.g., via sputtering). Coated articles according to certain example non-limiting embodiments of this invention may be used in applications such as solar cells, oven doors, defrosting windows, or other types of windows in certain example instances.

BACKGROUND AND SUMMARY OF EXAMPLE EMBODIMENTS

Conventional methods of forming TCOs on glass substrates require high glass substrate temperatures. Such methods include chemical pyrolysis where precursors are sprayed onto the glass substrate at approximately 400 to 500 degrees C., and vacuum deposition where the glass substrate is kept at about 150 to 300 degrees C. It is often not desirable to require such high glass substrate temperatures for TCO deposition processing.

Sputter deposition of a TCO at approximately room temperature would be desirable, given that most float glass manufacturing platforms are not equipped with in-situ heating systems. Thus, it would be an achievement in the art if a technique for sputter-depositing TCOs could be realized that would result in a sufficiently conductive film.

A limitation of low-temperature sputter deposition of TCOs is the low atom mobility on the glass substrate. This limits the ability of species to find their optimal positions, thereby reducing film quality due to less than desirable crystallinity. The low atom mobility is particularly problematic for dopant atoms which are often introduced to a stoichiometric TCO to produce free electrons. At low deposition temperatures, the dopant atoms tend to cluster such that their efficiency becomes reduced.

In certain example embodiments of this invention, one or more of the above problems are addressed by sputter-depositing a TCO inclusive film at a low temperature (e.g., less than about 150 degrees C., more preferably less than about 100 degrees C., and possibly at approximately room temperature) by sputter-depositing both a primary dopant and a co-dopant. The use of both the primary dopant and the co-dopant in depositing (e.g., sputter-depositing) the TCO inclusive film prevents or reduces the formation of compensating native defects in a wide-bandgap semiconductor material during the impurity introduction by controlling the Fermi level at or proximate the edge of the growth.

Immediately after being captured by surface forces, atoms start to migrate and follow the charge neutrality principle. The Fermi level is lowered at the growth edge by the addition of a small amount of acceptor impurity (such as Ag) so it prevents or reduces the formation of the compensating (e.g., negative in this case) species, such as zinc vacancies. After the initial stage of the semiconductor layer formation, the mobility of atoms is reduced and the probability of the point defect formation is primarily determined by the respective energy gain. Silver atoms for example in this particular example case tend to occupy interstitial sites where they play a role of predominantly neutral centers, forcing Al atoms to the preferable zinc substitutional sites, where Al plays the desired role of shallow donors, thus eventually raising the Fermi level. In addition, the provision of the co-dopant promotes declustering of the primary dopant, thereby freeing up space in the metal sublattice and permitting more Al to function as a charge carrier so as to improve conductivity of the film. Accordingly, the use of the co-dopant permits the primary dopant to be more effective in enhancing conductivity of the TCO inclusive film, without significantly sacrificing visible transmission characteristics. Furthermore, the use of the co-dopant improves crystallinity of the TCO inclusive film and thus the conductivity thereof, and grain size may also increase which can lead to increased mobility.

In certain example embodiments of this invention, the TCO film may be sputter-deposited on a glass substrate (either directly or indirectly) at approximately room temperature. In alternative embodiments, it is possible to pre-heat the glass substrate prior to the sputter-deposition of the TCO film. In yet another embodiment, it is possible to heat the glass substrate with the TCO layer after the deposition thereof, e.g., during a glass tempering and/or heat strengthening step.

In an example embodiment, a zinc oxide based film includes Al as a primary dopant and Ag as a co-dopant. In this respect, the Al is the primary charge provider. It has surprisingly been found that the introduction of Ag to $ZnAlO_x$ promotes declustering of the Al and permits more Al to function as a donor thereby improving crystallinity and conductivity of the film. In the case of introducing Ag as the co-dopant (acceptor) into ZnO, Ag facilitates the introduction of the primary donor dopant (Al). Certain example embodiments of this invention may also use the ability of silver to promote the uniform or substantially uniform distribution of donor-like dopants in wide-bandgap II-VI compounds, thereby allowing one to increase the effective dopant concentration in a polycrystalline film.

While silver is used as a co-dopant in certain example embodiments of this invention, it is possible to use another Group IB, IA or V element such as Cu or Au instead of or in addition to silver as the co-dopant.

In certain example embodiments of this invention, there is provided a method of making a coated article including a transparent conductive film, the method comprising: providing a glass substrate; sputtering at least one target comprising each of zinc, aluminum and silver in an atmosphere comprising oxygen so as to form a transparent conductive film on the glass substrate.

In other example embodiments of this invention, there is provided a method of making a coated article including a transparent conductive film, the method comprising: providing a substrate; sputtering at least one target comprising each of zinc, a primary metal dopant, and a co-dopant of at least one Group IB, IA or V element, wherein the sputtering is performed in an atmosphere comprising oxygen so as to form a transparent conductive film comprising zinc, oxygen, the primary metal dopant and the co-dopant on the substrate.

In still further example embodiments of this invention, there is provided a coated article comprising: a transparent conductive film provided on a glass substrate; and wherein the transparent conductive film comprises zinc aluminum oxide that is doped with silver in order to enhance electrical properties of the film.

In other example embodiments of this invention, there is provided a coated article comprising: a transparent conductive film provided on a substrate; and wherein the transparent conductive film comprises MAl oxide that is doped with silver in order to enhance electrical properties of the film. The metal M may be Zn or the like in certain example embodiments.

DETAILED DESCRIPTION OF THE INVENTION

Coated articles including conductive layer(s) according to certain example non-limiting embodiments of this invention may be used in applications such as solar cells, oven doors, defrosting windows, or other types of windows in certain example instances. For example and without limitation, the conductive layers discussed herein may be used as electrodes in solar cells, as heating layers in defrosting windows, as solar control layers in windows, or the like.

Figure 1:
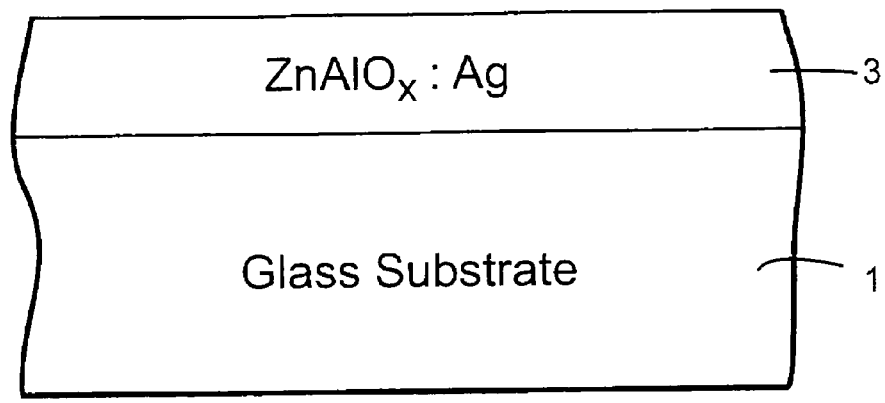
FIG. 1 is a cross-sectional view of a coated article according to an example embodiment of this invention.

FIG. 1 is a cross-sectional view of a coated article according to an example embodiment of this invention. The coated article includes glass substrate 1 and transparent electrically conductive layer 3 that is provided on the substrate. Glass 1 may be soda-lime-silica glass in certain example embodiments of this invention, although other types of glass may instead be used. In certain example embodiments of this invention, conductive film 3 may be of or include a transparent conducive oxide (TCO). Optionally, other layers may be provided between the glass substrate 1 and the transparent conductive layer 3. Layer 3 is said to be on the substrate 1, regardless of whether other layer(s) are provided therebetween. In certain example embodiments of this invention, the coated article has a visible transmission of at least about 30%, more preferably of at least about 50%, and even more preferably of at least about 70%.

In certain example embodiments of this invention, TCO inclusive film 3 is sputter-deposited onto substrate 1 at a low temperature (e.g., less than about 150 degrees C., more preferably less than about 100 degrees C., and possibly at approximately room temperature) so as to include both a primary dopant and a co-dopant. For purposes of example, the film 3 may be zinc oxide based, the primary dopant may be Al, and the co-dopant may be Ag. In such an example situation, the TCO film 3 may be of or include $ZnAlO_x$:Ag, where Ag is the co-dopant. Al is the primary charge carrier dopant. However, if too much Al is added (without Ag), its effectiveness as a charge carrier is compromised because the system compensates Al by generating native acceptor defects (such as zinc vacancies). Also, at low substrate temperatures, more clustered electrically inactive (yet optically absorbing) defects tend to occur. However, when Ag is added as a co-dopant, this promotes declustering of the Al and permits more Al to function as a charge generating dopant (Al is more effective when in the Zn substituting sites). Thus, the use of the Ag permits the Al to be a more effective charge generating dopant in the TCO inclusive film 3. Accordingly, the use of Ag in ZnAlO is used to enhance the electrical properties of the film.

In certain example embodiments of this invention, the amount of primary dopant (e.g., Al) in the film 3 may be from about 0.5 to 7%, more preferably from about 0.5 to 5%, and most preferably from about 1 to 4% (atomic %). Moreover, in certain example embodiments of this invention, the amount of co-dopant (e.g., Ag) in the film 3 may be from about 0.001 to 3%, more preferably from about 0.01 to 1%, and most preferably from about 0.02 to 0.25% (atomic %). In certain example instances, there is more primary dopant in the film than co-dopant, and preferably there is at least twice as much primary dopant in the film than co-dopant (more preferably at least three times as much, and most preferably at least 10 times as much). Moreover, there is significantly more Zn and O in the film 3 than both Al and Ag, as the film 3 may be zinc oxide based—various different stoichiometries may be used for film 3.

The use of both the primary dopant (e.g., Al) and the co-dopant (e.g., Ag) in depositing (e.g., sputter-depositing) the TCO inclusive film (e.g., $ZnAlO_x$:Ag) 3 prevents or reduces the formation of compensating native defects in a wide-bandgap semiconductor material during the impurity introduction by controlling the Fermi level at or proximate the edge of the growth. Immediately after being captured by surface forces, atoms start to migrate and follow the charge neutrality principle. The Fermi level is lowered at the growth edge by the addition of a small amount of acceptor impurity (such as Ag) so it prevents the formation of the compensating (negative in this case) species, such as zinc vacancies. After the initial stage of the semiconductor layer formation, the mobility of atoms is reduced and the probability of the point defect formation is primarily determined by the respective energy gain. Silver atoms in this particular case tend to occupy interstitial sites where they play role of predominantly neutral centers, forcing Al atoms to the preferable zinc substitutional sites, where Al plays the desired role of shallow donors, thus eventually raising the Fermi level. In addition, the provision of the co-dopant (Ag) promotes declustering of the primary dopant (Al), thereby freeing up space in the metal sublattice of the film 3 and permitting more primary dopant (Al) to function as a charge provider so as to improve conductivity of the film. Accordingly, the use of the co-dopant (Ag) permits the primary dopant (Al) to be more effective in enhancing conductivity of the TCO inclusive film 3, without significantly sacrificing visible transmission characteristics. Furthermore, the use of the co-dopant surprisingly improves crystallinity of the TCO inclusive film 3 and thus the conductivity thereof, and grain size of the crystalline film 3 may also increase which can lead to increased mobility.

Figure 2:
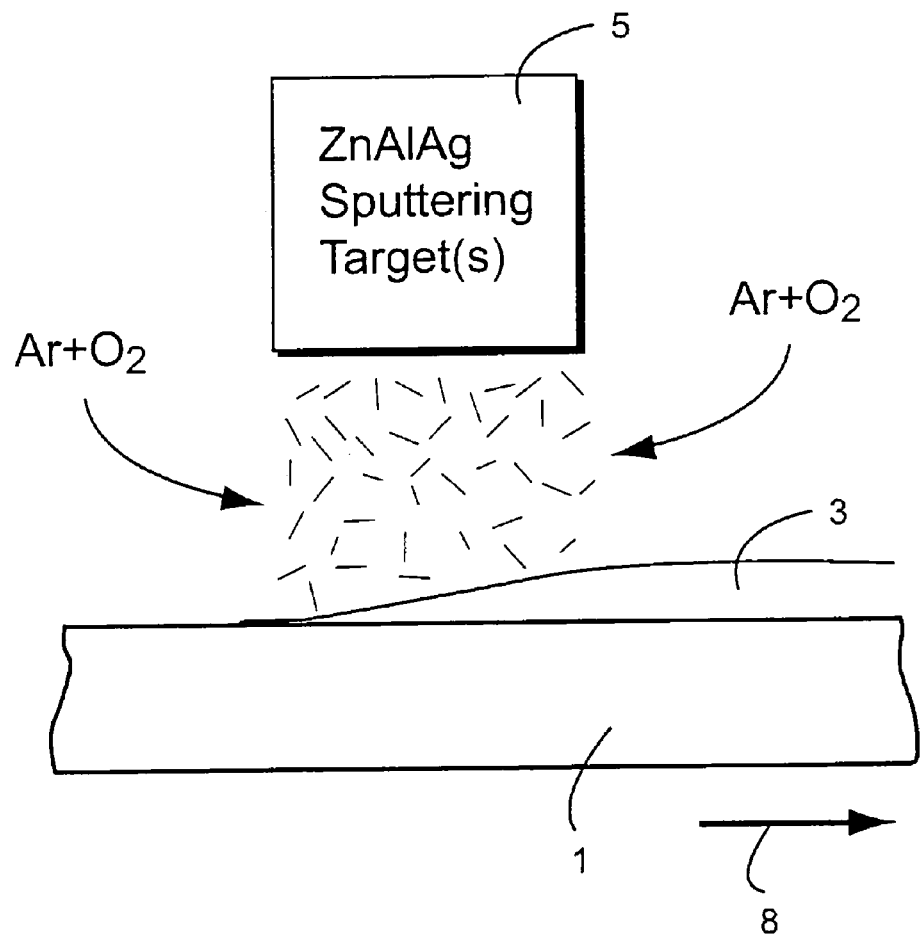
FIG. 2 is a schematic diagram of a method of making a coated article according to an example embodiment of this invention.

FIG. 2 is a schematic diagram illustrating an example of how the TCO inclusive film 3 may be sputter-deposited on substrate 1 according to an example embodiment of this invention. In certain example embodiments, the TCO film 3 may be sputter-deposited on glass substrate 1 (either directly or indirectly) at approximately room temperature. However, in alternative embodiments, it is possible to pre-heat the glass substrate prior to the sputter-deposition of the TCO film 3. In the FIG. 2 embodiment, the glass substrate may move in direction 8 under the sputtering target 5 so as to permit the film 3 to be formed thereon.

Referring to FIG. 2, a sputtering target(s) 5 is provided. In certain example embodiments, the sputtering target may be a rotatable magnetron type sputtering target, or alternatively may be a planar sputtering target, or any other suitable type of sputtering target. In certain example embodiments, the target 5 is made of or includes ZnAlAg, where Zn is the primary metal of the target, Al is the primary dopant, and Ag is the co-dopant. Thus, with respect to atomic % content of the target, the target 5 is characterized by Zn>Al>Ag, where at least 50% of the target is made up of Zn (more preferably at least 70%, and most preferably at least 80%). Moreover, the amount of primary dopant (e.g., Al) in the target 5 may be from about 0.5 to 7%, more preferably from about 0.5 to 5%, and most preferably from about 1 to 4% (atomic %); and the amount of co-dopant (e.g., Ag) in the target 5 may be from about 0.001 to 3%, more preferably from about 0.01 to 1%, and most preferably from about 0.02 to 0.25% (atomic %). When the target 5 is an entirely metallic or substantially metallic target, the target is typically sputtered in an atmosphere include oxygen gas (e.g., $O_2$). In certain example embodiments, the atmosphere in which the target is sputtered may include a mixture of oxygen and argon gas. The oxygen from the atmosphere contributes to forming the "oxide" nature of the film 3 on the substrate. It is also possible for other gases (e.g., nitrogen) to be present in the atmosphere in which the target 5 is sputtered, and thus some of this may end up in the film 3 on the substrate.

In other example embodiments, the sputtering target 5 may be a ceramic target. For example, target 5 may be of or include $ZnAlAgO_x$. A ceramic target may be advantageous in this respect because less oxygen gas would be required in the atmosphere in which the target is sputtered (e.g., and more Ar gas for example could be used).

While silver is discussed as a co-dopant in certain example embodiments of this invention, it is possible to use another Group IB, IA or V element such as Cu or Au instead of or in addition to silver as the co-dopant. Moreover, while Al is discussed as a primary dopant in certain example embodiments of this invention, it is possible to use another material such as Mn (instead of or in addition to Ag) as the primary dopant for the TCO film 3.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article comprising:
    a transparent conductive film provided on a glass substrate;
    wherein the transparent conductive film comprises zinc aluminum oxide that is doped with silver in order to enhance electrical properties of the film.

2. The coated article of claim 1, wherein the film includes more zinc than aluminum, and more aluminum than silver.

3. The coated article of claim 1, wherein at least one dielectric layer is provided between the glass substrate and the transparent conductive film.

4. The coated article of claim 1, wherein the coated article has a visible transmission of at least about 50%.

5. The coated article of claim 1, wherein the conductive film comprises at least about 25% zinc, from about 0.5 to 7% aluminum, and from about 0.001 to 3% silver.

6. A coated article comprising:
    a transparent conductive film provided on a substrate;
    wherein the transparent conductive film comprises MAl oxide that is doped with silver in order to enhance electrical properties of the film.

7. The coated article of claim 6, wherein M is zinc, and wherein there is more Al than Ag present in the film.

* * * * *